United States Patent [19]
Kaplan

[11] 3,851,276
[45] Nov. 26, 1974

[54] OSCILLATOR USING CONTROLLABLE GAIN DIFFERENTIAL AMPLIFIER WITH THREE FEEDBACK CIRCUITS

[75] Inventor: Leonard Abraham Kaplan, Fords, N.J.

[73] Assignee: RCA Corporation, New York, N.Y.

[22] Filed: Apr. 15, 1974

[21] Appl. No.: 461,269

[52] U.S. Cl. ............. 331/108 D, 331/109, 331/110, 331/141, 331/182, 331/183, 332/31 R, 332/31 T

[51] Int. Cl. ........ H03b 3/02, H03b 5/26, H03c 1/36

[58] Field of Search ........... 331/108 D, 109, 108 B, 331/110, 135, 137, 140–142, 182, 183; 332/31 R, 31 T

[56] References Cited

UNITED STATES PATENTS 3,579,150 5/1971 Badessa ...................... 331/108 D X 3,805,184 4/1974 Visioli, Jr. et al. .......... 331/108 D X

OTHER PUBLICATIONS

Bly, "Oscillator using operational amplifier," Wireless World, May 1969, p. 234.

*Primary Examiner*—Siegfried H. Grimm
*Attorney, Agent, or Firm*—H. Christoffersen; S. Cohen

[57] ABSTRACT

A controllable gain differential amplifier includes a frequency selective first feedback path for causing the amplifier to oscillate, a non-frequency selective second feedback path for limiting the amplifier closed loop gain and a third feedback path for controlling the amplifier open loop gain. In one embodiment the feedback signal produced by the third path is degenerative and enables external amplitude modulation while in another embodiment this feedback signal is regenerative and causes self-modulation of the oscillator.

9 Claims, 3 Drawing Figures

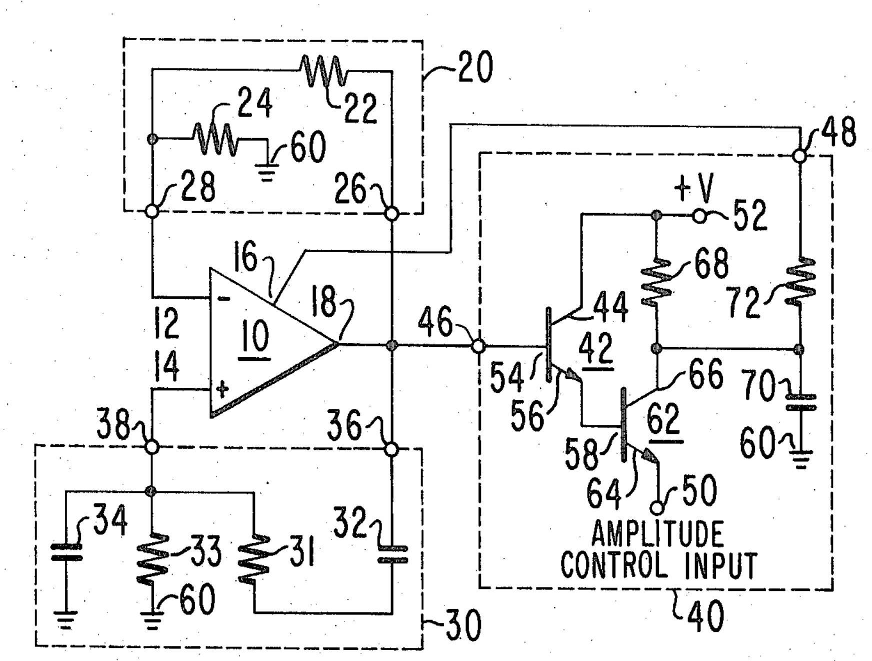
Fig. 1.
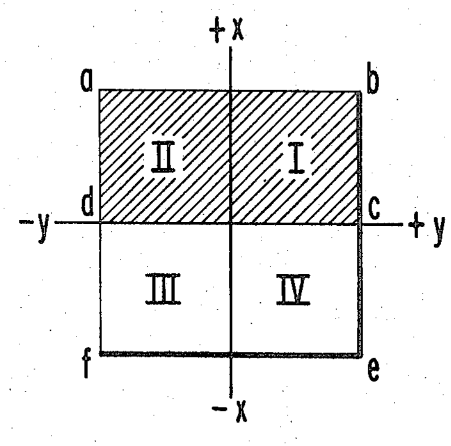
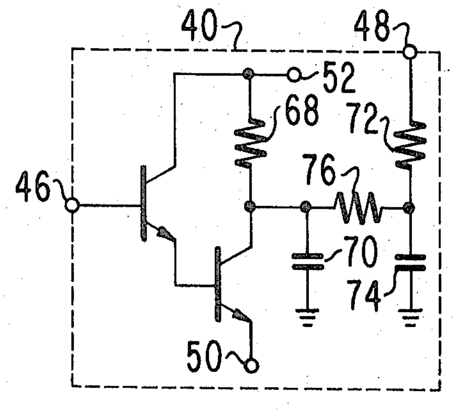
Fig. 2. Fig. 3.

OSCILLATOR USING CONTROLLABLE GAIN DIFFERENTIAL AMPLIFIER WITH THREE FEEDBACK CIRCUITS

This invention relates to oscillator circuits and particularly to feedback controlled oscillator circuits.

The uses of feedback oscillators are well known. Where it is desired to produce output signals of high spectral purity it is customary, for example, to use feedback oscillator configurations employing high Q resonant circuits. Also, numerous oscillator configurations are known which employ non-resonant feedback elements in combination with amplifiers of precisely controlled gain for producing output signals of low harmonic content.

Two advantages of the latter form of oscillator are (1) that high Q tuned circuits are avoided and (2) that the output frequency varies inversely as the first power and not as the square root of a feedback variable. Because of the inverse first power dependence, the latter form of oscillator is inherently capable of being operated over a wider frequency range for a given change in a reactive feedback variable (such as capacitance) and, additionally, frequency changing may be accomplished by varying a non-reactive element such as a resistor.

Known oscillators of this kind (such as those employing twin T, bridged T, Wien bridge or similar non-resonant feedback elements), on the other hand, suffer from one or more disadvantages. For example, where output signals of high spectral purity are required, it is necessary to initially assure that the loop gain is in excess of unity for starting the oscillator and, once started, to reduce the loop gain to satisfy the Barkhausen criteria for oscillations to be sustained at a fixed amplitude. Further, the amplitude must be maintained below saturation levels of active devices in the circuit. This is customarily accomplished by the use of a non-linear circuit element whose resistance changes as a function of signal amplitude in a sense to vary the loop gain inversely as the amplitude increases above a given value. Conventionally, lamps or thermistors are used for this purpose where their thermal time constant is relied upon to provide the loop filtering required for achieving low distortion.

While the conventional approach has the virtue of simplicity, the signal amplitude is necessarily a function of the environmental temperature to which the oscillator is subjected. Also, the amplitude is not easily programmable by externally supplied analog or digital input signals. Further, since loop filtering is dependent on a thermal time constant, its value necessarily limits the maximum oscillator period. While it is known that an oscillator output signal may be varied by analog or digitally controlled attenuators, such approaches degrade the spectral purity of the output signal by the additional distortion introduced by the attenuator.

Another disadvantage of many prior art oscillators of the kind described above is that their output signal amplitude tends to overshoot its final steady state value when the oscillator is initially turned on. Still another disadvantage of most prior art oscillators is that complex circuitry is required to achieve self-modulation, that is, for the oscillator to produce both a modulated carrier output frequency and simultaneously produce its own modulating frequency. (This form of signal is customarily obtained, for example, by combining two oscillators and a modulator.)

An oscillator in accordance with the present invention includes a controllable gain differential amplifier having a frequency selective feedback path for causing the amplifier to oscillate and a frequency independent feedback path for determining a parameter of the amplifier's closed loop gain. A further feedback path responsive to the amplitude of the amplifier's output signal and a reference signal controls the amplifier gain and thus the overall circuit gain for regulating the amplitude of the amplifier output signal and fulfilling the gain requirement for both starting the oscillator and producing sustained oscillations.

The invention is illustrated in the accompanying figures wherein like reference numbers represent like elements and in which:

FIG. 1 is a circuit diagram of a preferred embodiment of the invention;

FIG. 2 is a diagram illustrating two quadrant multiplication; and

FIG. 3 is a circuit diagram illustrating a modification of the circuit of FIG. 1.

FIG. 1 includes a controllable gain differential amplifier 10 for producing oscillations, a frequency independent feedback circuit 20 for limiting the amplifier closed loop gain, and a frequency dependent feedback circuit 30 for controlling the frequency of the oscillations. The circuit also includes a third feedback circuit 40 which, as will be explained, provides output signal detection, signal comparison and low pass filtering functions. These are for the purpose of controlling the amplifier gain, satisfying the Barkhausen criteria, starting the oscillator, controlling the amplitude of its output signal and, in a modified form, for causing self-modulation of the oscillator.

Amplifier 10 is a differential amplifier which, in addition to having the customary inverting 12 and noninverting 14 input terminals, also has a gain control terminal 16. The amplifier thus belongs to the general class of controllable gain amplifiers and, in this embodiment, to the particular class of amplifiers capable of two-quadrant multiplication of an input difference function and a gain control function.

A wide variety of circuit techniques are known and used in implementing gain control of amplifiers. It is helpful to an understanding of the present invention to review gain control techniques with particular attention to the specific requirements of the gain controlled differential amplifier 10 shown in FIG. 1. Two principal forms of gain controlled amplifiers (multipliers) presently widely used are the so-called pulse-width, pulse-height (PWPH) amplifier and the variable transconductance amplifier.

In PWPH gain controlled amplifiers, the input functions $x$ and $y$ are used to modulate the width and height of an internally generated pulse waveform. Integration of the pulse waveform produces an output signal proportional to the pulse area and hence the product of the input functions.

In variable transconductance amplifiers, the transconductance of a semiconductor device is made to vary in response to a control signal and suitable means are provided for effectively preventing the control signal itself from appearing in the amplifier output signal.

Both types of amplifiers are capable of four-quadrant as well as two-quadrant operation. The distinction between four and two quadrant operation is illustrated in FIG. 2 where the ordinate represents values of a gain control function x and the abscissa represents values of a controlled function y. The area bounded by letters *a*, *b*, *e*, and *f* represents operating values of *x* and *y* in a four quadrant multiplier. The term "four quadrant" is used to describe permissible values of x and y since, as shown, both may have positive or negative values, i.e., in a four quadrant multiplier, *x* and *y* may occupy each of the four quadrants, I, II, III, IV shown. In two quadrant multiplier, one or the other of *y* or *x* is constrained to only positive or only negative values. For example, in FIG. 2 the area bounded by *a*, *b*, *c* and *d* represents two quadrant operation where permissible values of *y* are + and − while the only permissible value of *x* is + .

Two quadrant operation of amplifier 10 is employed in the present invention. It will be apparent, however, that if one wished to use a four quadrant amplifier (multiplier) according to the present invention, this may be done by limiting the control signal in a suitable manner well known in the art. For example, diodes may be employed for limiting the control signal to only positive or only negative values.

A further requirement of amplifier 10 is that it be capable of amplifying the difference between two input signals. This may be accomplished by employing a separate differential amplifier having its output connected to one input terminal of a PWPH or variable transconductance multiplier. A better (more economical) approach, however, is to employ a variable gain differential amplifier which performs both circuit functions. Operational transconductance amplifiers, such as the RCA CA 3094, are presently available which perform the functions of both differential amplification and gain control (multiplication) in two quadrants. The CA 3094, for example, has a transconductance (and hence a voltage) gain proportional to a bias current supplied to its control terminal. Its gain is substantially zero for zero or negative bias (two quadrant operation).

Returning now to FIG. 1, amplifier 10 is connected at its output terminal 18 to input terminals 26, 36 and 46 of feedback circuits 20, 30 and 40, respectively. Output terminals 28, 38 and 48 of feedback circuits 20, 30 and 40 are connected, respectively, to inverting input terminal 12, non-inverting input terminal 14 and gain control terminal 16 of amplifier 10. Before discussing the details of the three feedback circuits, it is helpful first to consider the overall circuit operation in terms of the feedback circuit terminal characteristics. The circuit details will then be presented with a discussion of how selection of various element values determine the principal design parameters of the oscillator, such as its output signal frequency and amplitude.

Feedback circuit 20 attenuates signals supplied to its input terminal 26, producing an attenuated output signal at output terminal 28. Its attenuation characteristic is constant, i.e., independent of both the frequency and amplitude of signals supplied to it. Its purpose in the embodiment of FIG. 1 is to provide degenerative feedback for amplifier 10 of a value for limiting the closed loop gain to a value slightly greater than that necessary to sustain oscillations, to assure that the oscillator starts and, when starting, has minimal overshoot.

Feedback circuit 30 is also in the nature of an attenuator but has frequency dependent attenuation characteristics. Specifically, the voltage transfer function of the circuit of FIG. 1 has zeros at zero and infinite frequency and at least one maximum at a given frequency where the amplitude is limited to a maximum value and the phase shift is substantially zero. The principal purpose of this circuit is to determine the oscillator output signal frequency. (In the discussion of FIG. 3 it will be seen that the oscillator is capable of self-modulation, in which case this feedback circuit determines the carrier frequency).

Feedback circuit 40 has relatively complex terminal characteristics and determines numerous parameters of the oscillator output signal. Its overall function is to provide a gain control signal to amplifier 10 inversely proportional to the difference between the amplitude of the output signal produced by amplifier 10 and a reference signal supplied to an amplitude control terminal 50. Specifically, the gain control signal varies in a sense to increase the gain of amplifier 10 when its output signal amplitude is less than a given value determined by the amplitude control signal. Conversely, the gain control signal varies to decrease the open loop gain where the amplifier output signal amplitude is greater than the given value. Feedback circuit 40 also includes means for low pass filtering the control signal at a cut off frequency lower than that selected for feedback circuit 30. While a single pole filter characteristic is sufficient for the purposes of the embodiment of FIG. 1, additional poles may be added, as will be explained in the discussion of FIG. 3, for achieving the self-modulation effect previously mentioned.

Overall circuit operation, in terms of the characteristics of amplifier 10 and feedback circuits 20, 30 and 40, is as follows. Assume initially that circuit power has been turned off for a length of time sufficient for all circuit reactive components to have dissipated their stored energy so that the amplifier 10 output signal is substantially zero and the gain control signal produced by feedback circuit 40 is also substantially zero.

Upon application of circuit power and an amplitude control signal to control terminal 50, feedback circuit 40 tends to produce an output gain control signal of a value to increase the open loop gain of amplifier 10. The rate of rise of this control signal, however, is limited by the low pass filter characteristics of circuit 40 previously described. As the open loop gain of amplifier 10 increases, its overall (closed loop) gain begins to approach a limiting value determined by the inverse of the attenuation characteristic of feedback circuit 20.

Regenerative feedback circuit 30 provides slightly less attenuation than degenerative feedback circuit 20 at at least one frequency. A point will be reached as the open loop gain of amplifier 10 increases where the net feedback of amplifier 10 (i.e., the sum of that provided by circuits 20 and 30) is regenerative. When this occurs, oscillations result and the output signal amplitude would increase to a value limited only by the saturation characteristics of amplifier 10 were it not for the presence of feedback circuit 40. Circuit 40, modifies this action by changing the gain control signal it supplies to amplifier 10 (when the amplifier output signal exceeds a value determined by the amplitude control input signal) in a sense to reduce its open loop gain and thus the net closed loop gain.

By thus preventing saturation of amplifier 10, feedback network 40 assures linear circuit operation and low distortion in the amplifier 10 output signal. Due to its low pass characteristics, circuit 40 also assures relatively slow build up of the output signal, thus minimizing undesirable overshoot of the output signal (this is also further limited by circuit 20 which limits the maximum closed loop gain of amplifier 10 to a value only slightly greater than necessary to sustain oscillations). The net loop gain decreases to the exact value to sustain oscillations in response to changes in the gain control signal because of the reduction in open loop gain which occurs when the output signal amplitude reaches its final steady state value determined by the amplitude of the control signal. The amplitude control signal may be maintained at a reference level for producing constant amplitude output signals or, in the alternative, it may be varied thereby varying (modulating) the output signal amplitude. Where digital control of the oscillator amplitude is required, the digital control signals may be applied to a conventional D/A converter (such as an R-2R Ladder) for producing the amplitude control signal.

Turning now to the circuit details and to the design considerations for the feedback circuits, circuit 30 is seen to include resistor 31 and capacitor 32 connected in series between input terminal 36 and output terminal 38. Another resistor 33 and capacitor 34 are connected in parallel between output terminal 38 and ground 60. So connected, feedback circuit 30 is seen to be essentially a band pass filter having a fixed minimum attenuation in its pass band and infinite attenuation at zero and infinite frequency. In a given design, it is sometimes convenient to select equal values for resistors 31 and 33 and equal values for capacitors 32 and 34. If the element values have this relationship, the minimum attenuation will be 3:1 and the frequency where this occurs will be given by the reciprocal of two Π times the resistance-capacitance product. Since this frequency is dependent only upon the inverse first power of a variable, the circuit tuning range for a given increment of change (either resistance or capacitance) is necessarily much wider than that obtainable from resonant circuits whose tuning is determined by an inverse square root relationship.

Band stop filters, such as those employing the "Twin-T" principle, may also be employed in feedback circuit 30 rather than the band pass filter shown. It is essential, of course, if such a substitution is made to reverse the connections to the inverting and non-inverting input terminals of amplifier 10. Such a change is required so that the net feedback at a single frequency is regenerative and, aside from the reversal of the feedback signal sense, the circuit operation will be similar to that previously described.

In feedback circuit 20, output terminal 28 is connected to input terminal 26 by resistor 22 and to ground reference terminal 60 by resistor 24. It is thus a resistive attenuator (voltage divider) whose voltage transfer function is equal to the value of resistor 24 divided by the sum of the values of both resistors. In the circuit of FIG. 1 this attenuator is in the negative feedback loop of amplifier 10. Therefore the inverse of its voltage transfer function determines the amplifier closed loop gain when its open loop gain is sufficiently large to be neglected. If, as was previously suggested, equal valued resistors and capacitors are employed in feedback circuit 30, the loss in that circuit will be 3:1 at a single frequency where the phase shift is zero. Therefore, for the oscillator to satisfy the Barkhausen criteria for sustained oscillations (unity loop gain), the values of resistors 22 and 24 must be in the ratio of 2:1 so that the gain of amplifier 10 is precisely equal to the losses in feedback circuit 30. If this were the case, the oscillator would run, once started, but starting would present a problem since it is necessary that the loop gain (in the frequency selective feedback path) be in excess of unity in order for its amplitude to increase. Thus a change in loop gain is necessary, i.e., it must be slightly greater than unity to assure that the oscillator starts and then must reduce to unity once oscillations have begun to assure constant amplitude and low distortion. For this reason resistor 22 is selected to be slightly greater in value than that necessary to assure unity loop gain in the frequency selective feedback path (in the alternative, of course, resistor 24 may be made slightly less than the value required for unity loop gain.) For example, where the losses in the frequency selective path are 1:3, resistor 22 should be a few percent greater than twice the value of resistor 24, or resistor 24 may be made a few percent less than one half the value of resistor 22. In either case the gain of amplifier 10 will be slightly greater than 3 assuring that the net loop gain in the frequency selective path is slightly greater than unity. (This is reduced to exactly unity, it will be recalled, by the action of feedback circuit 40 once a desired final amplitude is reached, by causing a reduction in the amplifier open loop gain.)

As previously suggested, the present invention may be practiced by replacing feedback circuit 30, which has band-pass characteristic, with one having band stop characteristics (such as a twin-T). This change requires reversal of the inverting and non-inverting connections to amplifier 10 so that the frequency selective feedback circuit provides degenerative feedback while the non-frequency selective feedback circuit provides regenerative feedback. This change in the roles of the two circuits, 20 and 30, requires that the relationship between their attenuation characteristics discussed immediately above be reversed. For example, if such a change were made, resistors 22 and 24 should be selected to provide attenuation in the positive feedback path that is slightly less than that provided by the frequency selective (degenerative) feedback circuit (which is assumed to have band-stop characteristics) at the design frequency so that the net feedback is positive (regenerative) at that frequency.

In summary, feedback circuit 30 is frequency selective and may have either band-pass characteristics as in the example of FIG. 1 or it may have band-stop characteristics (which requires reversal of the inverting and noninverting terminals of amplifier 10). Feedback circuit 20, in either case, is an attenuator having frequency independent characteristics. The value of its attenuation is selected so that the net feedback for amplifier 10 (assuming its gain is biased for a relatively high value) is regenerative at a frequency in the pass (or stop) band of feedback circuit 30. The overall loop gain in the frequency selective feedback path is determined by feedback circuit 40 in either case, i.e., where feedback circuit 30 has either band-pass or band-stop characteristics.

In the preferred embodiment of FIG. 1 feedback circuit 40 includes transistor 42 which is connected at its collector 44 to operating potential input terminal 52 at its base 54 to input terminal 46, and at its emitter 56 to base 58 of transistor 62. Transistor 62 is connected at its emitter 64 to amplitude control input terminal 50 and at its collector 66 to terminal 52 via resistor 68. Collector 66 is also connected to capacitor 70 which is connected at its other terminal to ground and to output terminal 48 via resistor 72.

Operation of feedback circuit 40, neglecting for the moment the remainder of the circuitry of FIG. 1, is as follows. Assume that capacitor 70 initially is uncharged, amplitude control terminal 50 is maintained at ground potential and that a positive operating voltage +V is applied to terminal 52. Under these conditions, if the potential of input terminal 46 (relative to that of terminal 50) is less than the sum of the base-to-emitter voltage drops of transistors 42 and 62, both transistors will be off and capacitor 70 will receive a charging current through resistor 68 causing its potential to increase. Conversely, if a signal greater than the sum of the base-to-emitter voltage drops of transistors 42 and 62 is applied to input terminal 46, both transistors will turn on, shunting a portion of the charging current supplied by resistor 68 to ground. Where the potential applied to input terminal 46 is sufficiently large, the shunt current through transistor 62 may exceed the charging current provided by resistor 68 removing charge from capacitor 70, thereby decreasing its voltage.

Assume now that a variable potential is applied to amplitude control input terminal 50. In this case the rate of charging or discharging of capacitor 70 is determined by the difference between the signal applied to terminal 46 and the sum of the signal applied to control terminal 50 and the base-to-emitter voltage drops of transistors 42 and 62. Varying the magnitude of the amplitude control signal thus determines the amplitude of the input signal applied to terminal 46 required to charge and discharge capacitor 70. Thus, transistors 42 and 62 function in the manner of a variable threshold detector while resistor 68 and capacitor 70 function as a single pole low pass filter, i.e., a low pass filter whose phase shift cannot exceed 90 electrical degrees. The significance of the phase shift provided by this filter will be discussed in connection with FIG. 3 where a higher ordered filter characteristic is employed to affect self-modulation of the overall circuit.

Viewed another way, transistors 42 and 62 and resistor 68 operate as a differential amplifier where terminal 46 corresponds to an inverting input terminal, terminal 50 corresponds to a non-inverting terminal and collector 66 serves as the amplifier output terminal. The differential amplifier (so viewed) compares the output signal produced by amplifier 10 with the reference signal applied to amplitude control terminal 50 and produces a difference signal at collector 66. Capacitor 70 acts as a low pass filter for smoothing the difference signal and resistor 72 serves to couple the smoothed difference signal to gain control terminal 16 of amplifier 10.

Operation of feedback circuit 40 in the complete circuit of FIG. 1 is as follows. Amplifier 10 receives a gain control signal current at its gain control terminal 16 that is proportional to the voltage across capacitor 70. Where the amplifier gain control is proportional to input current (as in the RCA CA 3094), a resistor such as resistor 72 is required to limit current flow into the gain control terminal. This resistor may be omitted if amplifier 10 is of the kind having a gain proportional to a control voltage rather than a control current.

When power is initially applied, the voltage on capacitor 70 is substantially zero so that the gain of amplifier 10 is a minimum and no output signal is produced at its output terminal. Transistors 42 and 62 are therefore off and capacitor 70 is slowly charged by resistor 68. Resistor 72 therefore conducts an increasing current to gain control terminal 16 as capacitor 70 is charged, thus increasing the gain of amplifier 10. As the gain of amplifier 10 increases, a point will be reached where the net closed loop gain is in excess of unity and oscillations will be produced at output terminal 18 at a frequency determined by frequency selective feedback circuit 30. The amplitude of the oscillations will increase until a peak value is reached which is greater than the sum of the potential at control terminal 50 and the base-to-emitter voltage drops of transistors 42 and 62. When this occurs, transistors 42 and 62 turn on removing charge from capacitor 70 at a rate sufficient to prevent further increase in the amplitude of the output signal produced by amplifier 10. The amplitude of the oscillator output signal thus is stabilized at a fixed value.

Modulation of this output signal is achieved by varying the value of the amplitude control signal applied to control input terminal 50. The maximum modulation frequency is limited to a value less than the cut-off frequency of the single pole low pass filter in feedback circuit 40. The cut-off frequency of this filter may be varied (for example, by varying the value of capacitor 70), where amplitude modulation over a wide range of carrier frequencies and modulation bandwidths is desired. Where modulation is not required, amplitude control terminal 50 may be connected to a fixed reference potential such as ground and the cut-off frequency for the feedback circuit set to a fixed value less than the minimum frequency selected by feedback circuit 30.

FIG. 3 illustrates a modification of feedback circuit 40 of FIG. 1 in which an additional filter section is employed to cause self-modulation of the oscillator. The added section includes a further resistor 76 and capacitor 74 connected in a low pass configuration across capacitor 70. Resistor 72, previously connected to capacitor 70 is now connected to capacitor 74 to make the gain control signal supplied to amplifier 10 proportional to the voltage across capacitor 74 (rather than across capacitor 70).

Operation of the circuit of FIG. 1, thus modified, is similar to that previously discussed except that the additional phase shift introduced by resistor 76 and capacitor 74 results in delayed feedback of the gain control signal to amplifier 10. The effect of the delay is to vary the gain signal between regenerative and non-regenerative values. In other words, the gain control signal becomes oscillatory at a frequency determined by the phase shift of feedback circuit 40. Since the amplitude of the output signal produced by amplifier 10 is determined by feedback circuit 40 and its frequency is determined by feedback circuit 30, the net result is that amplifier 10 produces an amplitude modulated output signal.

Viewed another way, amplifier 10 functions as the active element in two oscillators simultaneously. Feedback circuit 30 determines one oscillator frequency (the carrier frequency) while feedback circuit 40 determines the other oscillator frequency (the modulation envelope). Even more complex modulation may be achieved by varying the potential of amplitude control terminal 50 which, in effect, doubly amplitude modulates the output signal. An additional feature of the modification described above is that a further output signal representative of the modulation envelope may be derived, for example, from the voltage across capacitor 74.

There have thus been shown and described simplified oscillator circuits capable of producing output signals of high spectral purity without the use of high Q tuned circuits, the output frequency thereof varying as the inverse first power of a feedback element for providing a wide tuning range and being controllable by varying either reactive or non-reactive elements. The oscillator circuits are self-starting and capable of producing low distortion long period signals not primarily limited by thermal time constant considerations. Further the oscillator circuits can be made to have substantially no output signal overshoot when first turned on and are capable of both external amplitude modulation and (as in the modification of FIG. 3) internal amplitude modulation by means of a self-generated modulating signal.

What is claimed is:

1. In combination:

controllable gain differential amplifier means having two input terminals for receiving separate input signals, a gain control terminal and an output terminal, said amplifier producing an output signal having a sense dependent on the sense of the difference between the two input signals, said amplifier having a gain proportional to the value of a gain control signal supplied to said gain control terminal when said gain control signal is of one sense, and said amplifier having a gain less than unity when said gain control signal is of opposite sense;

first and second feedback paths, each being connected between said output terminal and a separate one of said two input terminals, one path having a frequency selective attenuation characteristic, the other path having a frequency independent attenuation characteristic, said paths providing feedback signals in a sense for causing the amplifier output signal to oscillate; and a further feedback path connected between said output terminal and said gain control terminal for controlling the amplitude of said output signal, said further path including means for comparing said output signal with a reference signal and producing a difference signal, filter means for smoothing said difference signal, and means coupling the smoothed difference signal to said gain control terminal.

2. The combination recited in claim 1 wherein said means for comparing said output signal with a reference signal and producing a difference signal comprises:

a first node; and a further amplifier, responsive to said output signal and said reference signal, for supplying a current of one sense to said first node when said output and reference signals are of first relative values, said current being of opposite sense when said output and reference signals are of second relative values.

3. The combination recited in claim 2 wherein said further amplifier comprises:

a transistor having emitter, base and collector electrodes, said emitter electrode for receiving said reference signal, said base electrode being coupled to said output terminal, said collector electrode being connected to said first node;

a second node for receiving an operating potential; and impedance means coupled between said first node and said second node.

4. The combination recited in claim 2 wherein said filter means for smoothing said difference signal comprises:

a low pass filter, the cut-off frequency thereof being less than the frequency of the oscillations produced by said differential amplifier.

5. The combination recited in claim 4 wherein said low pass filter comprises:

a circuit reference potential point; and a capacitor connected between said first node and said circuit reference potential point.

6. The combination recited in claim 4 wherein said low pass filter provides phase shift of said smoothed difference signal of a value for causing periodic variations of the envelope of the oscillations produced by said amplifier, the frequency of said periodic variations being lower than the frequency of said oscillations, said low pass filter including at least two low pass filter sections.

7. The combination recited in claim 6 wherein said low pass filter comprises:

a circuit reference potential point;

a first capacitor connected between said first node and said circuit reference potential point;

a second node;

a resistor connected between said first and second nodes; and a second capacitor connected between said second node and said reference potential point.

8. The combination recited in claim 1 wherein said controllable gain differential amplifier comprises a two-quadrant operational transconductance amplifier, said operational transconductance amplifier differentially amplifying the signals supplied to said two input terminals in proportion to values of a bias current of one sense applied to its gain control terminal and having a differential gain of substantially zero for bias currents of opposite sense.

9. The combination recited in claim 8 wherein said first and second feedback paths comprise:

a circuit reference point;

four resistors connecting said two input terminals, said reference point and said output terminal in a bridge configuration; and two capacitors, one in series with one of the bridge resistors and the other in parallel with another of the bridge resistors.

* * * * *